United States Patent [19]

Vu

[11] Patent Number: 4,712,022

[45] Date of Patent: Dec. 8, 1987

[54] MULTIPLE INPUT OR-AND CIRCUIT FOR FET LOGIC

[75] Inventor: Tho T. Vu, Fridley, Minn.

[73] Assignee: Honeywell Inc., Minneapolis, Minn.

[21] Appl. No.: 750,107

[22] Filed: Jun. 28, 1985

[51] Int. Cl.[4] .................. H03K 19/094; H03K 17/16; H03K 5/08; H03K 3/26

[52] U.S. Cl. .................. 307/448; 307/450; 307/475; 307/443; 307/279; 307/558

[58] Field of Search ............... 307/443, 450, 453, 557, 307/556, 558, 475, 296 R, 279, 448, 468

[56] References Cited

U.S. PATENT DOCUMENTS 4,404,480  9/1983  Ransom et al. .................. 307/450

FOREIGN PATENT DOCUMENTS 0041415  12/1981  European Pat. Off. ............ 307/450
0084844  8/1983   European Pat. Off. ............ 307/279
0153774  9/1985   European Pat. Off. ............ 307/450

OTHER PUBLICATIONS

Katsu, et al, A Source Coupled FET Logic—A New Current-Mode Approach to GaAs Logics, IEEE Transactions on Electron Devices, vol. ED-32, No. 6, Jun. 1985.

Shimano, et al, GaAs High Speed Digital ICs, ISSCC 83/Wed., Feb. 23, 1983.

Katsu, et al, A GaAs Monolithic Frequency Divider Using Source Coupled FET Logic, Electron Device Letters, vol. EDL-3, No. 8, Aug. 1982.

Primary Examiner—Stanley D. Miller
Assistant Examiner—Trong Quang Phan
Attorney, Agent, or Firm—John G. Shudy, Jr.

[57] ABSTRACT

An OR-AND logic circuit includes a plurality of OR gates wherein each OR gate includes a plurality of source coupled FETs and the inputs to each OR gate are the control gates of the FETs. A logic node serves as the output for each OR gate. A unidirectional current conducting means, such as a Schottky diode, is connected to each output logic node of each OR gate. One terminal of each unidirectional current conducting means is connected to a common logic node. Current passing through a load means passes through the common logic node and is divided among the unidirectional current conducting means so that a logical AND function is provided at the common logic node with the logic condition at the output logic nodes of the OR gates serving as the inputs to the AND gate. Multiple levels of such OR-AND circuits can be provided with the AND output of one level serving as the input to an OR gate of the next stage.

19 Claims, 8 Drawing Figures

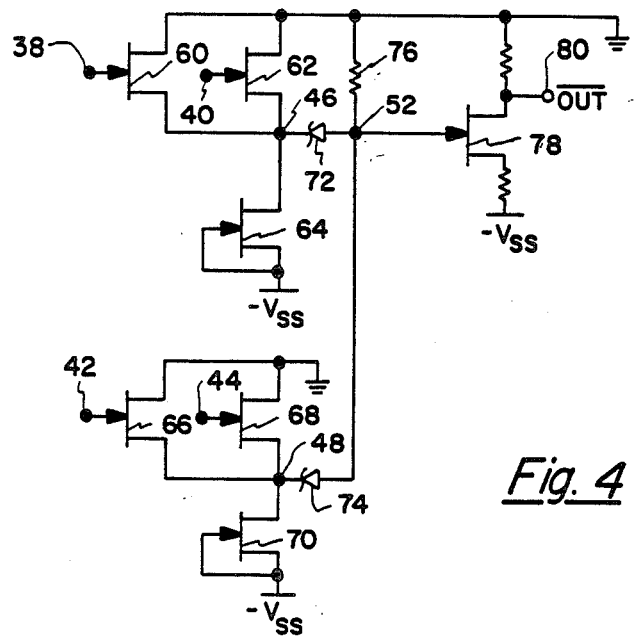
_Fig. 4_
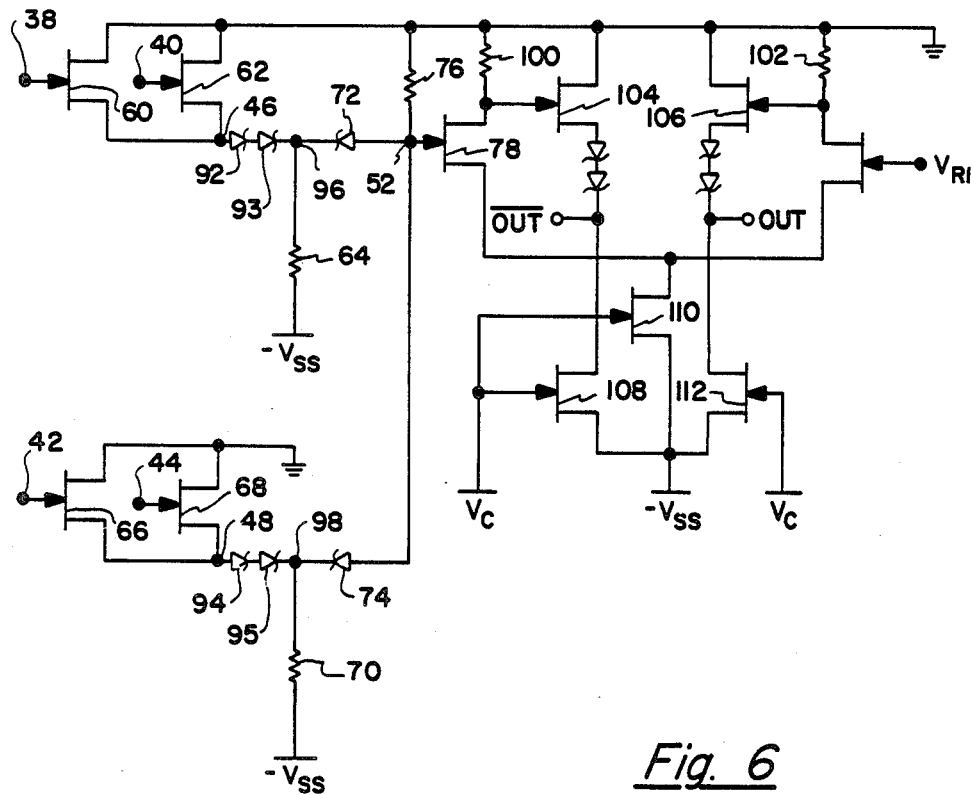
_Fig. 6_

MULTIPLE INPUT OR-AND CIRCUIT FOR FET LOGIC

BACKGROUND OF THE INVENTION

1. Field of the Invention

This invention relates to OR.AND logic circuits Where field effect transistors (FETs) are employed as separate inputs to an OR gate and unidirectional current conducting means, such as a diodes, are employed as inputs to an AND gate.

2. Related Art

FIG. 1 shows a known basic digital inverter circuit 10 employing source coupled FET logic (SCFL). Therein, FETs 12 and 14 have their source regions coupled at 15. FETs 12 and 14 switch their on/off state when voltage $V_{IN}$ exceeds voltage $V_{Rl}$. The on/off state of FETs 12 and 14 are always opposite one another. Thus, current flowing between ground and $V_{ss}$ is steered either through resistor 16 or 18, but never both. FETs 20 and 22 are buffers and the output is taken at either NOR or OR.

FIG. 2 shows an extension of the circuit of FIG. 1. Therein an R-S clocked flip-flop 24 is shown employing SCFL. In effect, the switching gate of circuit 10 (i.e., FET 12) is expanded in series into stacked FETs 26 and 28. Current will flow from ground through resistor 30 only if the SET voltage is higher than the voltage RESET and the CLOCK voltage is higher than voltage $V_{R2}$.

FIG. 2 essentially expands the current source of FIG. 1 (i.e, $R_s$ and $V_{ss}$ in combination) in series by stacking FETs 26 and 28 in series. FETS 26 and 28 could be used to provide an AND logic function due to their series configuration. However, since the fan-in of the logic gate in FIGS. 1 and 2 is limited, in large part due to the current available to the gate, in order to perform logic operations on a number of inputs which is larger than the fan-in one would have to add additional FET AND gates or increase the available current. The first option greatly increases chip area and the latter, in addition to increasing power consumption, is often difficult to achieve since the voltage supply size is limited by chip design rules.

SCFL is an attractive logic family because it provides very fast switching. It is also nearly independent of the threshold voltage of the switching FET since the critical level of the transfer characteristics is equal to the externally applied reference voltage $V_R$. SCFL is particularly useful when metal-semiconductor FETs (MESFETs) are employed with a GaAs substrate.

Therefore, it is highly desirable to have an OR-AND logic gate which can perform AND operations on a large number of inputs without stacking FETs as in FIG. 2 or without adding FET AND gates, while also maintaining the voltage supply at typical chip design levels.

SUMMARY OF THE INVENTION

The present invention is a digital logic circuit for switching a FET having a control gate. The circuit includes two OR gates wherein the inputs of each OR gate are the control gates of FETs. The FETs in each OR gate are source coupled at a first logic node and second logic node, respectively. First and second unidirectional current conducting means, such as Schottky diodes, are connected respectively to the first and second logic nodes. The first and second unidirectional current conducting means are also connected in parallel at a third logic node. Current must pass through the unidirectional current conducting means to go from the third logic node to either the first or second logic node.

The third logic node performs an AND logic function with the logic values of the first and second logic node serving as inputs. The logic condition at the third logic node is then typically applied to the gate of the switching FET. Additional OR and AND gates configured as above can be added in parallel at the third logic node. Further, additional levels of OR and AND gates can be added to the above configurations with the output of one level of AND gates serving as one input to an OR gate of a successive level.

The invention is particularly suited for use with MESFETS and in integrated circuits where the substrate is GaAs.

BRIEF DESCRIPTION OF THE DRAWINGS

FIG. 4 is a schematic of a preferred embodiment of the present invention.

FIG. 6 is a modification of the circuit of FIG. 4.

DESCRIPTION OF THE PREFERRED EMBODIMENTS

As used herein FET includes any solid state transistor including a substrate with a principal surface having a first doped region (e.g., a drain) and a second doped region (e.g., a source) extending into the substrate from the principal surface (wherein the first and second doped regions are spaced along the principal surface and a control gate overlays at least part of the spaced region. A control voltage is applied to the control gate to control the flow of conductors between the drain and source. FETs includes MESFETs, metal-oxide semiconductor FETs (MOSFETs), junction FETs (JFETs), modulation doped FETs (MODFETs) and any enhancement or depletion mode configurations of the same. Where important, the particular kind of FET will be specified below. Also, "connected" refers to either directly connected to another element or node, or connected to another element or node by way of an intermediate element(s) or node(s).

Figure 3:
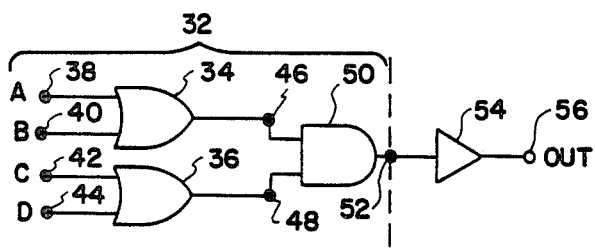
FIG. 3 is a logic gate diagram of one logic level of the present invention.

FIG. 3 shows a first level or basic circuit of the present invention. Therein circuit 32 includes first and second OR gates 34 and 36. For purposes of illustration, each OR gates 34 and 36 has two inputs (inputs 38, 40, 42 and 44). An OR logic function is provided at node 46 for gate 34 and node 48 for gate 36. The logic value at each node 46 and 48 thus becomes one of the inputs to AND gate 50, whose output is at node 52. Typically, the logic state at node 52 is inverted by inverter 54 with the final output at OUT node 56. The logic function performed on logic values A, B, C and D input to circuit 32 as shown in FIG. 3 is $\overline{(A+B)(C+D)}$, i.e., an OR-AND-INVERT or OR-NAND function.

Figure 3A:
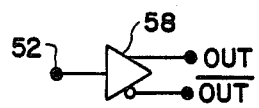
FIG. 3A is an alternate output for the logic gate diagram of FIG. 3.

Similarly, a differential amplifier 58 (see FIG. 3A) can be substituted for inverter 54 to amplify the output at node 52 and either invert it or not.

FIG. 4 is a detailed schematic of one preferred embodiment of the present invention. Therein, depletion mode MESFETs are employed. FETs 60 and 62 serve as the inputs to OR gate 34. A current source is formed by FET 64 (with its gate and source shorted to function as a linear load over the operating range of the circuit) and negative voltage source $-V_{ss}$.

FETs 66 and 68 serve as the inputs to OR gate 36. Another current source is formed by FET 70 and negative voltage supply $-V_{ss}$. AND gate 50 of FIG. 3 is formed by first and second undirectional current conducting means, such as Schottky diodes 72 and 74, connected in parallel so that they share the current passing through node 52. That is, the anode of each diode 72 and 74 is connected together at node 52 with the cathode of diode 72 connected to node 46 and the cathode of diode 74 connected to node 48. A load, such as resistor 76, is connected between a reference point (e.g., ground) and node 52.

The only time that no substantial current will flow through load 76 is when both diodes 72 and 74 are off. A high logic level (defined as logic 1) appears at nodes 46, 48 and 52 unless one of FETs 60, 62, 66 or 68 is switched on by an input voltage. Thus both diodes 72 and 74 are off unless one of FETs 60, 62, 66 or 68 is switched on. This allows diodes 72 and 74 to form an AND gate with the inputs at nodes 46 and 48, and the output at node 52. Further, the parallel connection of FETs 60 and 62, and 66 and 68, allow them to perform an OR operation on the respective inputs.

The voltage at node 52 is typically employed to switch a FET such as FET 78. If the output is taken at the drain of FET 78 (i.e, node 80), inversion of the logic condition at node 52 is provided.

Figure 5:
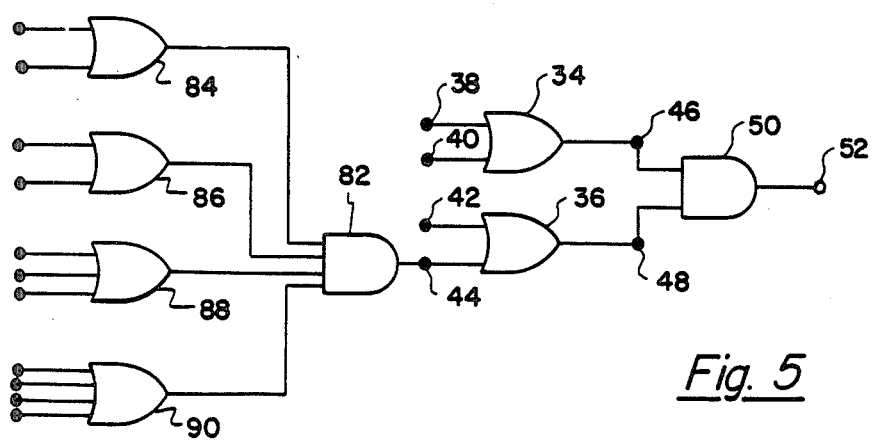
FIG. 5 is an expanded version of the logic diagram of FIG. 3 showing an additional logic level.

The OR and AND gates of FIG. 4 provide the basic building block of the present invention. In effect, an AND function is provided by parallel current source/diode combinations. This pattern can be repeated (with varying numbers of inputs to the OR gates) to provide multiple levels of OR-AND functions. FIG. 5 depicts one possible expansion with two levels of OR-AND functions. Each AND gate input would require only one additional diode connected to a current source. Additional AND inputs can be added without regard to the normal fan-in limit of the switching FET (e.g., FET 78). This is because the current passing through the switching FET 78 in FIG. 4 is not being shared among other FETs or elements in order to provide the AND operation. Instead, the present invention provides parallel, separate current sources for each diode serving as an input to the AND gate.

Figure 1:
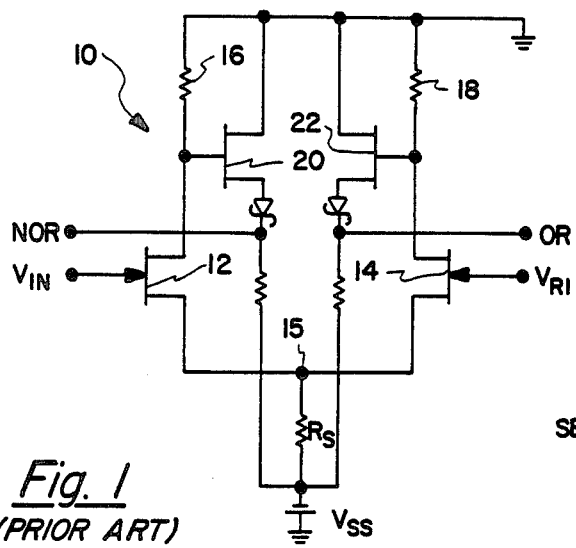
FIG. 1 is a prior art SCFL inverter.
Figure 2:
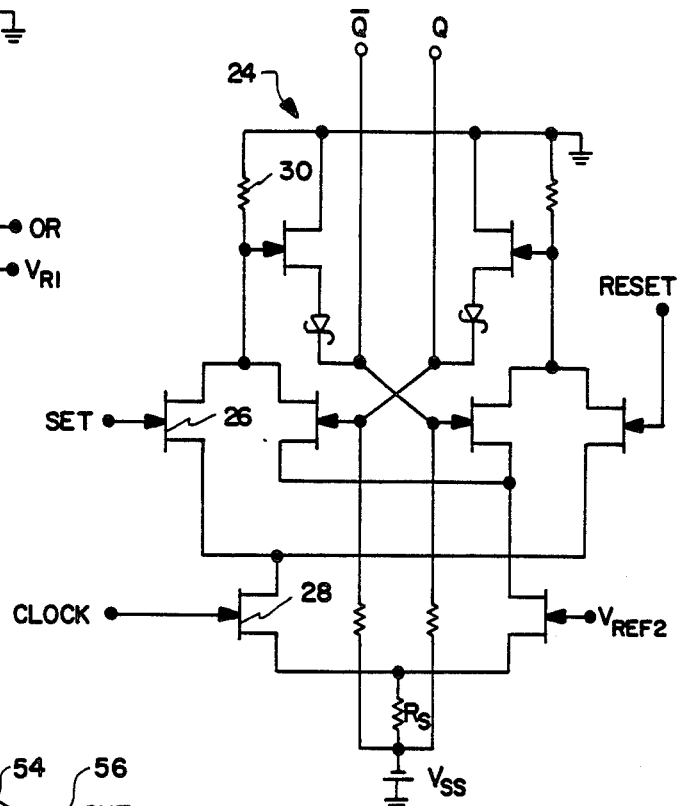
FIG. 2 is a prior art SCFL R-S flip-flop.

In contrast to the prior art, note that the number of AND gate inputs in FIG. 2 would be limited to the fan-in of the logic gate (e.g, 3) due to the stacking of FETs 26 and 28 in series.

FIG. 5 depicts an additional level of OR-AND gate including AND gate 82 and OR gates 84, 86, 88 and 90. For purposes of illustration, AND gate 82 has four inputs, a condition which the prior art with stacked switching FETs connected in series would have great difficulty in achieving.

FIG. 6 shows additional features which may be included in the OR-AND gates of FIG. 4 and a typical output configuration. Voltage level shifting diodes 92, 93, 94 and 95 can be provided and are typically employed when depletion mode MESFETs are used as the FETs in the OR gates due to the negative threshold voltage of the depletion mode MESFET. Only two voltage level shifting diode (92 and 93, or 94 and 95) are shown as connected to node 46 or 48, but one or several voltage level shifting diodes in series can be used. The logic condition at nodes 96 and 98 tracks that of nodes 46 and 48, respectively, but the voltage level is simply shifted. Nodes 96 and 98 can be viewed as the first and second logic nodes instead of nodes 46 and 48.

As shown in FIG. 6, any of the resistors in the circuits are interchangeable with FETs adapted to serve as a load. In practice, source gate shorted FETs are preferable to resistors.

FIG. 6 includes a differential amplifier (see 58 of FIG. 3A) as an output stage. Differential amplifier 58 operates in typical current steering fashion with current passed only through load 100 or load 102 as the voltage at node 52 switches FET 78 on or off in relation to the reference voltage $V_{RI}$. Additional current driving is provided for both $\overline{OUT}$ and OUT by FETs 104 and 106.

For convenience, current is controlled through the differential amplifier by a control voltage $V_C$ applied to the gate of load FETs 108, 110 and 112.

The circuit in FIG. 6 has been simulated and verified as functional. Table 1 summarizes the simulated results for two cases.

TABLE 1

| Parameter | Case 1 | Case 2 | Unit |
|---|---|---|---|
| FET size | 1 × 10 | 1 × 10 | $\mu m^2$ |
| FET $V_{Threshold}$ | −0.5 | −0.9 | v |
| Power Dissipation | 2.98(1.5)* | 9.72(8.7)* | mw |
| $R_{100, 102}$ | 20 | 5 | K ohm |
| $R_{108, 112}$ | 30 | 1 × 10 FET | K ohm |
| $R_{110}$ | 40 | 1 × 5 FET | K ohm |
| $R_{76}$ | 100 | 100 | K ohm |
| $R_{64, 70}$ | 20 | 20 | K ohm |
| $D_{92, 94}$ | yes | yes | — |
| $D_{93, 95}$ | no | yes | — |
| $V_{ss}$ | −5.0 | −5.0 | v |
| $V_{R1}$ | −1.8 | −2.5 | v |
| $V_{IN}$ | −2.3 to −1.3 | −3.0 to −2.0 | v |
| $V_{OUT}$ | −2.25 to −1.5 | −3.05 to −2.2 | V |
| Voltage Swing | 750 | 850 | mv |
| $\tau_{pd}$ | 0.325(0.260)* | 0.360/3.32** (0.154)*/(0.477)* | ns |
| $C_{Load}$ | 23 | 23/350 | fF |
| $C_{gso}$ | 12.23 | 12.23 | fF |

Figure 7:
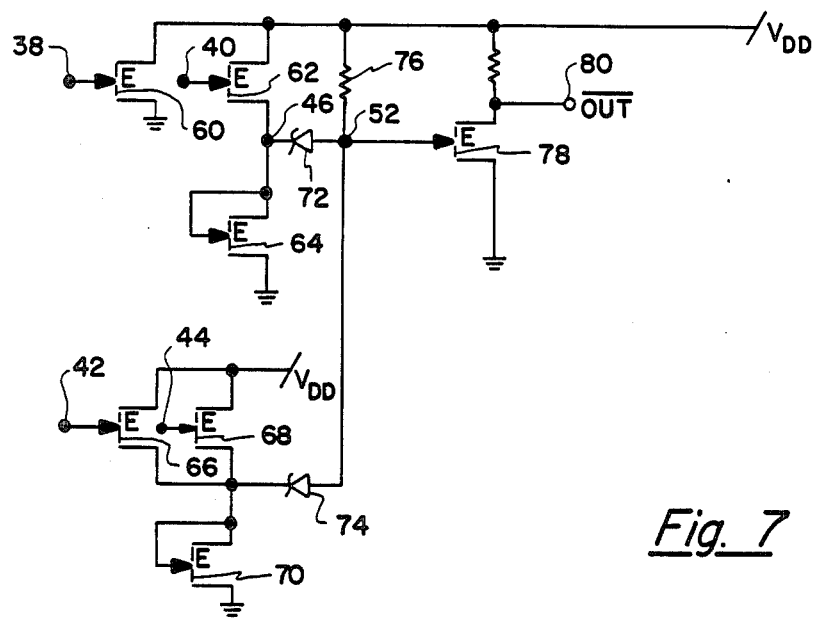
FIG. 7 is another modification of the circuit of FIG. 4.

*( ) indicates the parameter value for the amplification or SCFL stage only.
**gate delay with 350 fF capacitance loading The circuit of FIGS. 4 and 6 have been shown with depletion mode MESFETs. They also employ negative power supplies. Those skilled in the art will recognize that these circuits can be readily modified to employ other FETs, enhancement mode FETs and positive power supplies. FIG. 7 is an example of an enhancement mode MESFET version with a positive power supply. Similar structure in FIGS. 7 and 4 are like numbered. An E indicates an enhancement mode FET. A popular configuration is to use enhancement mode MESFETs as logic elements with depletion mode MESFETs as load elements. The circuits have been described in terms of positive logic but they are readily adapted to negative logic. GaAs is the preferred substrate material of the present invention, however other semiconductor materials, and particularly Si, can be employed.

What is claimed is:

1. A logic circuit for applying a logic signal to the control gate of a switching FET, said circuit including a reference node, comprising:
   a first logic node;
   a first FET having a drain region, a source region and a control gate, wherein the drain region of said first FET is connected to said reference node, said first logic node is connected to the source region of said first FET, and data is input to the control gate of said first FET;
   first load means connected to said first FET;
   a first diode having an anode and a cathode, wherein the cathode of said first diode is connected to said first logic node;
   a second logic node;
   a second FET having a drain region, a source region and a control gate, wherein the drain region of said second FET is connected to said reference node, said second logic node is connected to the source region of said second FET, and data is input to the control gate of said second FET;
   second load means connected to said second FET;
   a second diode having an anode and a cathode, wherein the cathode of said second diode is connected to said second logic node;
   third load means; and
   a third logic node, wherein the anodes of said first and second diodes are each connected to said third logic node, wherein said third load means is connected to and between said reference node and said third logic node and wherein said third logic node is connected to said control gate of said switching FET.

2. The circuit of claim 1 wherein:
   said reference node is connected to a voltage reference point;
   said first load means is connected to a first voltage supply; and
   said second load means is connected to a second voltage supply.

3. The circuit of claim 2 further including a third FET having a source region, drain region and control gate, wherein the source region of said third FET is connected to the source region of said first FET, the drain region of said third FET is connected to said reference node and data signals are input to the control gate of said third FET, so that a logic OR function is provided at said first logic node upon data being input to the control gates of said first and third FETs;
   fourth FET having a source region, drain region and control gate, wherein the source region of said fourth FET is connected to the source region of said second FET, the drain region of said fourth FET is connected to said reference node and data signals are input to the control gate of said fourth FET, so that a logic OR function is provided at said second logic node upon data being input to the control gates of said second and fourth FETs; and
   wherein a logic AND function is provided at said third logic node upon input of the logic data signals at said first and second logic nodes.

4. The circuit of claim 1 further including:
   first voltage level shifting diode having an anode and cathode, wherein the cathode of said first voltage level shifting diode is connected to said first logic node and the anode of said first voltage level shifting diode is connected to the source region of said first FET; and
   second voltage level shifting diode having an anode and a cathode, wherein the cathode of said second voltage level shifting diode is connected to said second logic node and the anode of said second voltage level shifting diode is connected to the source region of said second FET.

5. The circuit of claim 1 further including:
   means for inverting the logic signal applied to the control gate of said switching FET.

6. The circuit of claim 5 wherein said inverting means includes a differential amplifier having first and second branches, and a voltage reference point in said first branch, wherein the voltage applied to the control gate of said switching FET is compared to the voltage at said voltage reference point in order to steer current through one and only one of said first or second branches.

7. A multi-level OR/AND logic circuit, comprising:
   at least first and second logic levels, wherein each of said logic levels includes two logic OR gates and a logic AND gate, wherein each of said logic OR gates includes an OR logic node and a FET having a control gate and a source region, with said source region connected to said OR logic node and data input to said control gate, and wherein said AND gate includes an AND logic node and a separate diode associated with each OR gate, each of said diodes having an anode and a cathode, and said cathodes of each of said diodes connected to said AND logic node and said anode of one and only one of said diodes connected to one and only one of said OR logic nodes; and
   wherein said AND logic node of said first logic level is connected to a control gate of one of said FETs of said second logic level so that the output of said first logic level is an input to said second logic level.

8. A multiple input OR/AND circuit for FET logic comprising:
   a first plurality of FETs wherein each FET has a gate, a drain and a source;
   a first plurality of input nodes wherein each input node is connected one-to-one to said gate of each corresponding FET of said first plurality of FETs;
   a second plurality of FETs wherein each FET has a gate, a drain and a source;
   a second plurality of input nodes wherein each input node is connected one-to-one to said gate of each corresponding FET of said second plurality of FETS;
   a first connection node connected to said drains of said first plurality of FETs;
   a second connection node connected to said drains of said second plurality of FETs;
   a third connection node connected to said sources of said first plurality of FETs;
   a fourth connection node connected to said sources of said second plurality of FETs;
   a first diode having a cathode connected to said third connection node, and having an anode;
   a second diode having a cathode connected to said fourth connection node, and having an anode;
   a logic node connected to said anode of said first diode and connected to said anode of said second diode;
   an output FET having a gate connected to said logic node, and having a drain and a source;

an output node connected to said drain of said output FET;
a fifth connection node;
a first load connected to said third connection node and to said fifth connection node;
a second load connected to said fourth connection node and to fifth connection node;
a third load connected to said logic node and to said first connection node;
a fourth load connected to said first connection node and to said drain of said output FET; and
a fifth load connected to said source of said output FET and to said fifth connection node.

9. Apparatus of claim 8 wherein:
said first and second connection nodes are connected to a zero voltage reference potential; and
said fifth connection node is connected to a negative voltage potential.

10. Apparatus of claim 9 wherein:
said first load comprises a FET having a gate and a source connected to said fifth connection node, and having a drain connected to said third connection node; and
said second load comprises a FET having a gate and a source connected to said fifth connection node, and having a drain connected to said fourth connection node.

11. Apparatus of claim 9 further comprising:
first voltage level shifting means comprising at least one diode having an anode connected to said third connection node and having a cathode connected to said first load and to said cathode of said first diode, and said first voltage level shifting means being the only connection connecting said third connection node to said first load and to said cathode of said first diode; and
second voltage level shifting means comprising at least one diode having an anode connected to said fourth connection node and having a cathode connected to said second load and to said cathode of said second diode, and said second voltage level shifting means being the only connection connecting said fourth connection node to said second load and to said cathode of said second diode.

12. Apparatus of claim 9 wherein:
said first load comprises a FET, connected as an active load, having a drain connected to said third connection node, and having a gate and a source connected to said fifth connection node; and
said second load comprises a FET, connected as an active load, having a drain connected to said fourth connection node, and having a gate and a source connected to said fifth connection node.

13. Apparatus of claim 12 wherein:
said FETs are depletion mode metal-semiconductor FETs;
said diodes are Schottky diodes; and
said apparatus is integrated in a gallium arsenide substrate.

14. Apparatus of claim 8 further comprising a differential amplifier having an input node connected to said output node, and having complementary outputs.

15. Apparatus of claim 8 wherein said FETs are enhancement mode FETs.

16. Apparatus of claim 15 wherein:
said first and second connection nodes are connected to a positive voltage potential; and
said fifth connection node is connected to a zero voltage reference potential.

17. Apparatus of claim 16 wherein:
said first load comprises a FET having a gate and a drain connected to said third connection node and having a source connected to said fifth connection node; and
said second load comprises a FET having a gate and a drain connected to said fourth connection node and having a source connected to said fifth connection node.

18. Apparatus of claim 17 wherein:
said FETs are enhancement mode metal-semiconductor FETs; and
said diodes are Schottky diodes.

19. Apparatus of claim 1 wherein:
said first load means is connected to the source region of said first FET; and
said second load means is connected to the source region of said second FET.

* * * * *

UNITED STATES PATENT AND TRADEMARK OFFICE
CERTIFICATE OF CORRECTION

PATENT NO. : 4,712,022

DATED : December 8, 1987

INVENTOR(S) : THO T. VU

It is certified that error appears in the above-identified patent and that said Letters Patent is hereby corrected as shown below:

Column 8, line 10, cancel "!2" and substitute --12--.

Signed and Sealed this

Twenty-fourth Day of May, 1988

Attest:

DONALD J. QUIGG

Attesting Officer

Commissioner of Patents and Trademarks